United States Patent
Wen et al.

(10) Patent No.: US 10,686,414 B2
(45) Date of Patent: Jun. 16, 2020

(54) LOAD-ADAPTIVE CLASS-G AMPLIFIER FOR LOW-POWER AUDIO APPLICATIONS

(71) Applicant: MEDIATEK INC., Hsin-Chu (TW)

(72) Inventors: Sung-Han Wen, Hsinchu (TW); Chien-Ming Chen, Hsinchu (TW); Chuan-Hung Hsiao, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/151,339

(22) Filed: Oct. 4, 2018

(65) Prior Publication Data

US 2019/0199300 A1 Jun. 27, 2019

Related U.S. Application Data

(60) Provisional application No. 62/610,585, filed on Dec. 27, 2017.

(51) Int. Cl.
| | | |
|---|---|---|
| H03F 1/30 | (2006.01) | |
| H03F 3/21 | (2006.01) | |
| H03F 1/02 | (2006.01) | |
| H03F 3/183 | (2006.01) | |
| H03F 3/187 | (2006.01) | |
| H03F 3/213 | (2006.01) | |

(52) U.S. Cl.
CPC ............ *H03F 3/21* (2013.01); *H03F 1/0211* (2013.01); *H03F 1/0244* (2013.01); *H03F 3/183* (2013.01); *H03F 3/187* (2013.01); *H03F 3/213* (2013.01); *H03F 2200/03* (2013.01); *H03F 2200/511* (2013.01)

(58) Field of Classification Search
CPC ........................................................ H03F 1/30
USPC .................................................. 330/297, 279
See application file for complete search history.

(56) References Cited

U.S. PATENT DOCUMENTS

| | | | |
|---|---|---|---|
| 6,614,310 | B2 | 9/2003 | Quarfoot |
| 7,782,141 | B2 | 8/2010 | Witmer |
| 7,808,324 | B1 | 10/2010 | Woodford |
| 8,446,219 | B2 | 5/2013 | Mohajeri |
| 8,829,979 | B2 | 9/2014 | Galal et al. |
| 2008/0159567 | A1 | 7/2008 | Lesso |
| 2014/0103996 | A1* | 4/2014 | Horiguchi ............... H03F 1/52 330/127 |
| 2016/0165348 | A1 | 6/2016 | Ilango |
| 2017/0310288 | A1 | 10/2017 | Das |

OTHER PUBLICATIONS

"A 60 mW Class-G Stereo Headphone Driver for Portable Battery-Powered Devices", IEEE Journal of Solid-State Circuits, vol. 47, No. 8, Aug. 2012.

(Continued)

*Primary Examiner* — Henry Choe
(74) *Attorney, Agent, or Firm* — Winston Hsu

(57) ABSTRACT

The present invention provides a class-G amplifier, wherein the class-G amplifier includes an amplifier stage, an impedance detector and a power source. In the operations of the class-G amplifier, the amplifier stage is supplied by a supply voltage, and amplifies an input audio signal to generate an output audio signal, and the impedance detector is configured to detect an output impedance of the amplifier stage to generate a detection result, and the power source refers to the detection result to determine a level and a switching frequency of the supply voltage.

14 Claims, 4 Drawing Sheets

(56) References Cited

OTHER PUBLICATIONS

"A 130dB PSRR, 108dB Dr and 95dB SNDR,Ground-Referenced Audio Decoder with PSRR-enhanced Load-adaptive Class-G 16Ohm Headphone Amplifiers", IEEE Asian Solid-State Circuits Conference, Nov. 9-11, 2015.

"A Load-Adaptive Class-G Headphone Amplifier With Supply-Rejection Bandwidth Enhancement Technique", IEEE Journal of Solid-State Circuits, vol. 51, No. 10, Oct. 2016.

* cited by examiner

LOAD-ADAPTIVE CLASS-G AMPLIFIER FOR LOW-POWER AUDIO APPLICATIONS

CROSS REFERENCE TO RELATED APPLICATIONS

This application claims the priority of U.S. Provisional Application No. 62/610,585, filed on Dec. 27, 2017, which is included herein by reference in its entirety.

BACKGROUND

A class-G amplifier provides different voltage rails for different levels of output signals, and the class-G amplifier having rail switching mechanism can decrease power consumption and increase efficiency. Conventional rail switching mechanism may work well for heavy load (i.e. higher output current and lower output impedance), but it is not suitable for the light load (i.e. lower output current and higher output impedance). Specifically, the class-G amplifier generally has a charge-pump for adjusting the supply voltage provided to an output stage. However, power loss of the charge-pump is increased under a higher voltage rail switching frequency and a larger difference between the voltage rails, and hence the total power consumption may be worsened when the class-G amplifier operates with the light load.

SUMMARY

It is therefore an objective of the present invention to provide a class-G amplifier, which can adjust a level and a switching frequency of the voltage rails based on the output impedance to have better power consumption even if the class-G amplifier has the light load, to solve the above-mentioned problems.

According to one embodiment of the present invention, a class-G amplifier includes an amplifier stage, an impedance detector and a power source. In the operations of the class-G amplifier, the amplifier stage is supplied by a supply voltage, and amplifies an input audio signal to generate an output audio signal, and the impedance detector is configured to detect an output impedance of the amplifier stage to generate a detection result, and the power source refers to the detection result to determine a level and a switching frequency of the supply voltage.

According to another embodiment of the present invention, a control method of a class-G amplifier is disclosed, wherein the class-G amplifier has an amplifier stage for amplifying an input audio signal to generate an output audio signal, and the control method comprises the steps of: detecting an output impedance of the amplifier stage to generate a detection result; and referring to the detection result to determine a level and a switching frequency of a supply voltage supplied to the amplifier stage.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
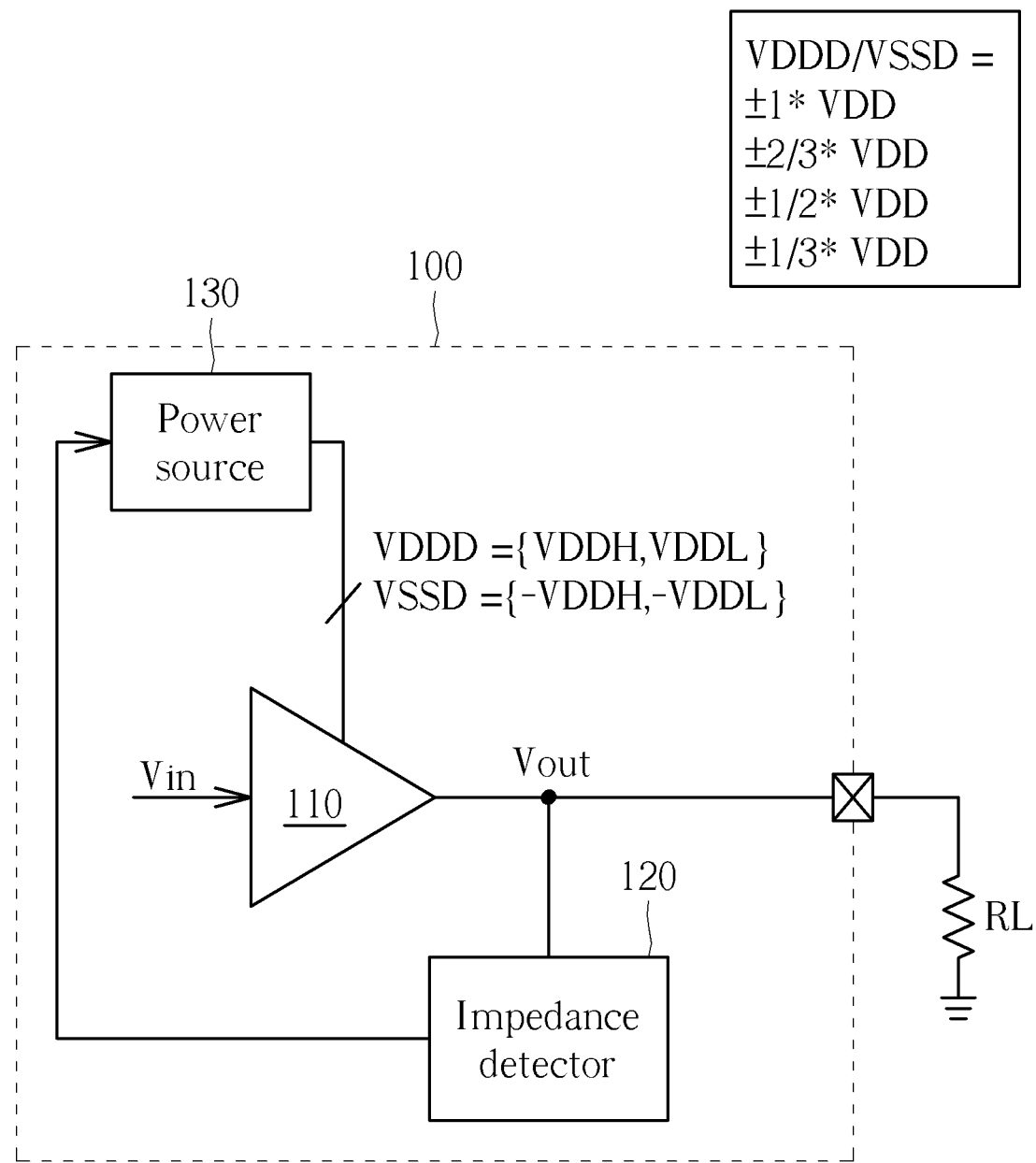
FIG. 1 is a diagram illustrating a class-G amplifier according to one embodiment of the present invention.

FIG. 1 is a diagram illustrating a class-G amplifier 100 according to one embodiment of the present invention. As shown in FIG. 1, the class-G amplifier 100 comprises an amplifier stage 110, an impedance detector 120 and a power source 130. In this embodiment, the class-G amplifier 100 is applied to a headset, and the class-G amplifier 100 coupled to a load RL (i.e. an impedance of the headset) via a pad of a chip. In addition, the power source 130 can be a charge-pump, a buck converter, a boost converter or a linear regulator capable of providing a positive supply voltage VDDD and a negative supply voltage VSSD to the amplifier stage 110.

In the operations of the class-G amplifier 100, the amplifier stage 110 can be regarded as an output stage, and the amplifier stage 110 is configured to receive an input audio signal Vin to generate an output audio signal Vout. The impedance detector 120 is configured to detect the output impedance RL of the amplifier stage 110 to generate a detection result, and the power source 130 refers to the detection result to determine a level and a switching frequency of the positive supply voltage VDDD and the negative supply voltage VSSD.

In this embodiment, the positive supply voltage VDDD is selected from a first voltage rail VDDH or a second voltage rail VDDL, and the negative supply voltage VSSD is selected from a third voltage rail "−VDDH" or a fourth voltage rail "−VDDL", according to an amplitude of the input audio signal Vin or the output audio signal Vout, and the power source 130 refers to the detection result to determine the levels of the first voltage rail VDDH, the second voltage rail VDDL, the third voltage rail "−VDDH" and the fourth voltage rail "−VDDL". Taking FIG. 1 as an example, the power source 130 may provide a plurality of predetermined voltages ±1*VDD, ±⅔*VDD, ±½*VDD and ±⅓*VDD (VDD can be any suitable DC voltage such as 1.8V), and the power source 130 may refer to the detection result to control the first voltage rail VDDH to be VDD, (⅔)*VDD or (½)*VDD, and control the second voltage rail VDDL to be one of the (⅔)*VDD, (½)*VDD or (⅓)*VDD that is lower than the first voltage rail VDDH, and the third voltage rail "−VDDH" and the fourth voltage rail "−VDDL" are negative values of the first voltage rail VDDH and the second voltage rail VDDL, respectively.

In the embodiment shown in FIG. 1, if the headset has the large impedance RL such as 100 ohm, 300 ohm or 600 ohm, a higher supply voltage is required to drive the amplifier stage 110 to provide sufficient volume to a user, so the power source 130 may control the first voltage rail VDDH to be VDD or (⅔)*VDD, and control the second voltage rail VDDL to be (½)*VDD or (⅓)*VDD. If the headset has the lower impedance RL such as 16 ohm or 32 ohm, the lower supply voltage is more suitable than the higher supply voltage to drive the amplifier stage 110 to provide the volume to the user for the low power consideration, so the power source 130 may control the first voltage rail VDDH to be (½)*VDD, and control the second voltage rail VDDL to be (⅓)*VDD. In this embodiment, because the first voltage rail VDDH and the second voltage rail VDDL can be selected from many predetermined voltages by the output impedance RL, so the power consumption can be optimized.

Figure 2:
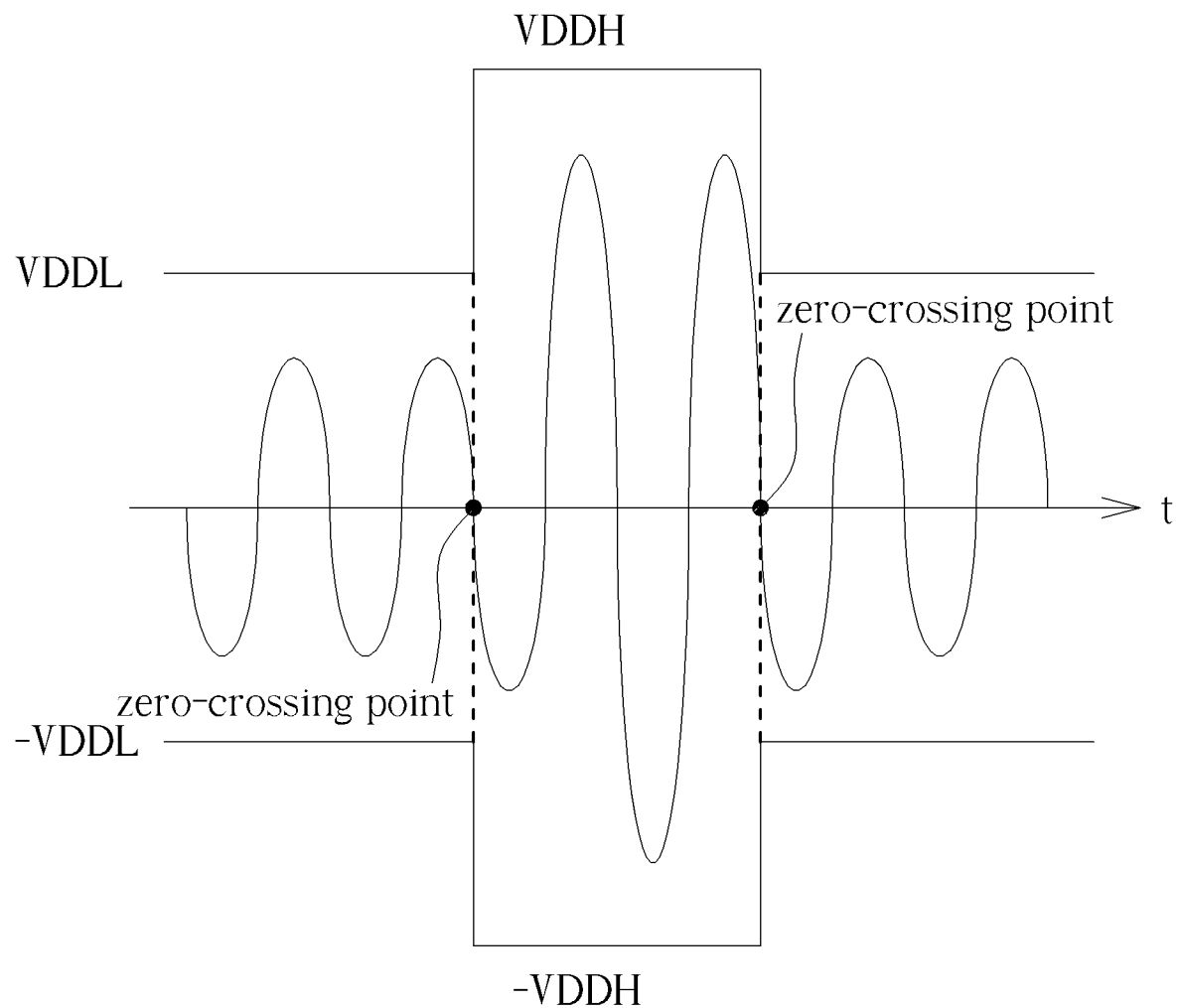
FIG. 2 shows a diagram of controlling the positive supply voltage and the negative supply voltage according to one embodiment of the present invention.

FIG. 2 shows a diagram of controlling the positive supply voltage VDDD and the negative supply voltage VSSD according to one embodiment of the present invention. In the first case indicating that the output impedance RL is high, when it is detected that the input audio signal Vin has a lower amplitude, the power source 130 may use the second voltage rail VDDL and fourth voltage rail "−VDDL" having ±⅓*VDD to drive the amplifier stage 110; and when it is detected that the input audio signal Vin has the large amplitude, the power source 130 may use the first voltage rail VDDH and third voltage rail "−VDDH" having ±1*VDD to drive the amplifier stage 110. In the second case indicating that the output impedance RL is low, when it is detected that the input audio signal Vin has the lower amplitude, the power source 130 may use the second voltage rail VDDL and fourth voltage rail "−VDDL" having ±⅓*VDD to drive the amplifier stage 110; and when it is detected that the input audio signal Vin has the large amplitude, the power source 130 may use the first voltage rail VDDH and third voltage rail "−VDDH" having ±½*VDD to drive the amplifier stage 110.

In addition, the power source 130 may switch the positive supply voltage VDDD between the first voltage rail VDDH and the second voltage rail VDDL, and switch the negative supply voltage VSSD between the third voltage rail "−VDDH" and the fourth voltage rail "−VDDL" at zero-crossing points of the output audio signal to prevent glitches on the output audio signal Vout.

It is noted that the quantity of the predetermined voltages and the voltage values provided by the power source 130 and the selections of the first voltage rail VDDH and the second voltage rail VDDL are four illustrative purposes only. As long as the power source 130 provides more than two predetermined voltages, and the first voltage rail VDDH can be assigned to have different predetermined voltages under different output impedances RL (or different output impedance ranges), these designs shall fall within the scope of the present invention.

In order to improve the power consumption more efficiently, the power source 130 may have a hold time mechanism, and the power source 130 may use a hold time to adjust the positive supply voltage VDDD between the first voltage rail VDDH and the second voltage rail VDDL, and adjust the negative supply voltage VSSD between the third voltage rail "−VDDH" and the fourth voltage rail "−VDDL" according to the amplitude of the input audio signal Vin, wherein the hold time may be a variable value that is determined according to the output impedance RL. Specifically, When the impedance detector 120 generates the detection result indicating the higher output impedance RL such as 300 ohm or 600 ohm, the power source 130 may use a longer hold time such as 20 ms or 40 ms to delay the adjustment of the positive supply voltage VDDD; and when the impedance detector 120 generates the detection result indicating the lower output impedance RL such as 16 ohm or 32 ohm, the power source 130 may use a short hold time delay the adjustment of the positive supply voltage VDDD, or the power source 130 may immediately adjust the positive supply voltage VDDD without using any hold time.

Figure 3:
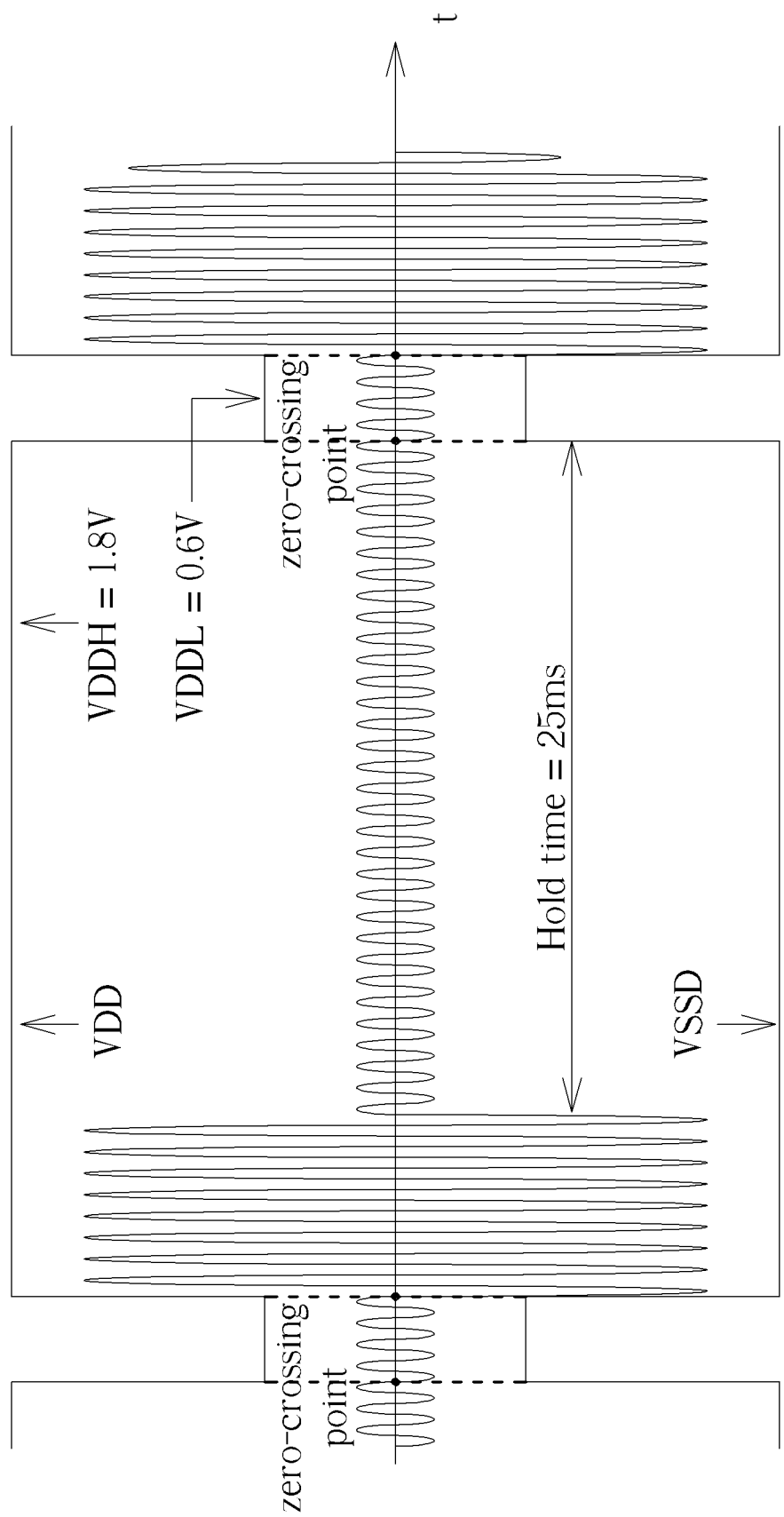
FIG. 3 shows a diagram of controlling the positive supply voltage and the negative supply voltage according to one embodiment of the present invention.

FIG. 3 shows a diagram of controlling the positive supply voltage VDDD and the negative supply voltage VSSD according to one embodiment of the present invention. In the embodiment shown in FIG. 3, the impedance detector 120 generates the detection result indicating the higher output impedance RL, and the power source 130 refers to the detection result to determine the longer hold time as 25 ms. As shown in FIG. 3, when it is detected that the amplitude of the input audio signal Vin or the output audio signal Vout becomes small and the positive supply voltage VDDD should be switched from the first voltage rail VDDH to the second voltage rail VDDL, the power source 130 wait the hold time of 25 ms then switches the positive supply voltage VDDD to the second voltage rail VDDL at the zero-crossing point of the output audio signal Vout. Because the power consumption of the power source 130 depends on the voltage rail switching frequency and voltage difference between the voltage rails, using the longer hold time to delay the adjustment of the positive supply voltage VDDD can greatly decrease the voltage rail switching frequency, and the power consumption of the power source 130 can be improved to reduce the overall power consumption of the class-G amplifier 100. In addition, if the difference between the voltage rails (i.e. (VDDH−VDDL) is high and the higher voltage rail difference increases the power loss of the power source 130, the power source 130 can mitigate the overall power consumption by setting the longer hold time.

Figure 4:
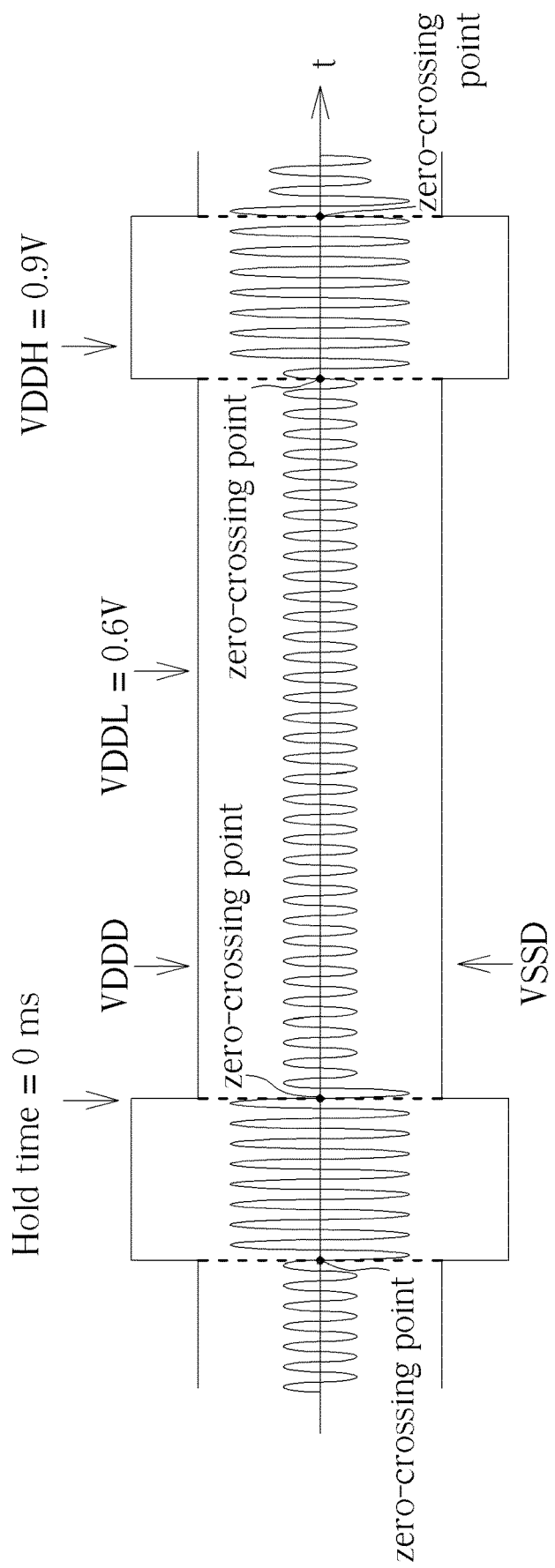
FIG. 4 shows a diagram of controlling the positive supply voltage and the negative supply voltage according to another embodiment of the present invention.

FIG. 4 shows a diagram of controlling the positive supply voltage VDDD and the negative supply voltage VSSD according to another embodiment of the present invention. In the embodiment shown in FIG. 4, the impedance detector 120 generates the detection result indicating the lower output impedance RL, and the power source 130 refers to the detection result to determine the hold time is equal to zero (i.e. no hold time is used). As shown in FIG. 4, when it is detected that the amplitude of the input audio signal Vin or the output audio signal Vout becomes small, the power source 130 immediately switches the positive supply voltage VDDD to the second voltage rail VDDL at the zero-crossing point of the output audio signal Vout. Because the positive supply voltage VDD is immediately adjusted to fit the waveform of the input audio signal Vin or the output audio signal Vout, the power loss of the class-G amplifier 100 can be minimized to increase the power efficiency.

Briefly summarized, in the class-G amplifier of the present invention, the power source can refer to the output impedance to determine the level and the switching frequency of the supply voltage rail to optimize the overall power consumption of the class-G amplifier. In addition, a hold time mechanism may be used to provide a variable hold time for the different output impedances to control the switching frequency of supply rails and to then improve the power consumption and efficiency of the class-G amplifier.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A class-G amplifier, comprising:
an amplifier stage supplied by a supply voltage, for amplifying an input audio signal to generate an output audio signal;
an impedance detector, for detecting an output impedance of the amplifier stage to generate a detection result; and
a power source, for referring to the detection result to determine a level of the supply voltage;
wherein the supply voltage is selected from a first voltage rail or a second voltage rail according to an amplitude of the input audio signal or the output audio signal, and the power source refers to the detection result to determine the level(s) of at least one of the first voltage rail and the second voltage rail; and the power source adjusts the supply voltage between the first voltage rail and the second voltage rail at zero-crossing points of the output audio signal.

2. The class-G amplifier of claim 1, wherein the first voltage rail is greater than the second voltage rail, and when the detection result indicates that the impedance belongs to a first range, the power source controls the first voltage rail to have a first level; and when the detection result indicates that the impedance belongs to a second range, the power source controls the first voltage rail to have a second level different from the first level.

3. The class-G amplifier of claim 1, wherein the first voltage rail is greater than the second voltage rail, and the power source controls the first voltage rail to have a first level when the output impedance has a first value, and the power source controls the first voltage rail to have a second level greater than the first level when the output impedance has a second value greater than the first value.

4. The class-G amplifier of claim 1, wherein the first voltage rail is greater than the second voltage rail, and the power source refers to the detection result to select one from more than two predetermined voltages to control the level of the first voltage rail.

5. The class-G amplifier of claim 1, wherein the power source uses a hold time to adjust the supply voltage between the first voltage rail and the second voltage rail according to the amplitude of the input audio signal or the output audio signal.

6. The class-G amplifier of claim 5, wherein the hold time used by the power source is determined according to the detection result.

7. The class-G amplifier of claim 6, wherein the power source uses a first hold time when the output impedance has a first value, and the power source uses a second hold time longer than the first hold time when the output impedance has a second value greater than the first value.

8. A control method of a class-G amplifier, wherein the class-G amplifier has an amplifier stage for amplifying an input audio signal to generate an output audio signal, and the control method comprises:
selecting a first voltage rail or a second voltage rail to serve as the supply voltage according to an amplitude of the input audio signal or the output audio signal;
detecting an output impedance of the amplifier stage to generate a detection result; and
referring to the detection result to determine the level(s) of at least one of the first voltage rail and the second voltage rail supplied to the amplifier stage;
wherein the step of selecting the first voltage rail or the second voltage rail to serve as the supply voltage according to the amplitude of the input audio signal or the output audio signal comprises:
adjusting the supply voltage between the first voltage rail and the second voltage rail at zero-crossing points of the output audio signal.

9. The control method of claim 8, wherein the first voltage rail is greater than the second voltage rail, and the step of referring to the detection result to determine the level(s) of at least one of the first voltage rail and the second voltage rail comprises:
when the detection result indicates that the impedance belongs to a first range, controlling the first voltage rail to have a first level; and
when the detection result indicates that the impedance belongs to a second range, controlling the first voltage rail to have a second level different from the first level.

10. The control method of claim 8, wherein the first voltage rail is greater than the second voltage rail, and the step of referring to the detection result to determine the level(s) of at least one of the first voltage rail and the second voltage rail comprises:
controlling the first voltage rail to have a first level when the output impedance has a first value; and
controlling the first voltage rail to have a second level greater than the first level when the output impedance has a second value greater than the first value.

11. The control method of claim 8, wherein the first voltage rail is greater than the second voltage rail, and the step of referring to the detection result to determine the level(s) of at least one of the first voltage rail and the second voltage rail comprises:
referring to the detection result to select one from more than two predetermined voltages to control the level of the first voltage rail.

12. The control method of claim 8, wherein the step of selecting the first voltage rail or the second voltage rail to serve as the supply voltage according to the amplitude of the input audio signal or the output audio signal comprises:
using a hold time to adjust the supply voltage between the first voltage rail and the second voltage rail according to the amplitude of the input audio signal or the output audio signal.

13. The control method of claim 12, wherein the step of selecting the first voltage rail or the second voltage rail to serve as the supply voltage according to the amplitude of the input audio signal or the output audio signal further comprises:
determining the hold time according to the detection result.

14. The control method of claim 13, wherein the step of determining the hold time according to the detection result comprises:
using a first hold time when the output impedance has a first value; and
using a second hold time longer than the first hold time when the output impedance has a second value greater than the first value.

* * * * *